(12) United States Patent
Gibson

(10) Patent No.: US 12,707,604 B1
(45) Date of Patent: Aug. 11, 2026

(54) COOLANT FLOW CONTROL

(71) Applicant: Auradine, Inc., Santa Clara, CA (US)

(72) Inventor: Glen Gibson, Santa Clara, CA (US)

(73) Assignee: Auradine, Inc., Santa Clara, CA (US)

( * ) Notice: Subject to any disclaimer, the term of this patent is extended or adjusted under 35 U.S.C. 154(b) by 0 days.

(21) Appl. No.: 19/436,785

(22) Filed: Dec. 30, 2025

Related U.S. Application Data

(63) Continuation of application No. 19/255,543, filed on Jun. 30, 2025, now Pat. No. 12,520,459.

(51) Int. Cl.
*H05K 7/20* (2006.01)
*H05K 1/02* (2006.01)

(52) U.S. Cl.
CPC ....... *H05K 7/20772* (2013.01); *H05K 1/0203* (2013.01); *H05K 7/20254* (2013.01); *H05K 7/20272* (2013.01); *H05K 7/20281* (2013.01); *H05K 7/20836* (2013.01)

(58) Field of Classification Search
CPC ........... H05K 7/20254; H05K 7/20772; H05K 7/20781
See application file for complete search history.

(56) References Cited

U.S. PATENT DOCUMENTS 4,257,552 A 3/1981 Farkas et al.
5,731,954 A 3/1998 Cheon
5,833,523 A 11/1998 Hykes
6,313,990 B1 11/2001 Cheon
7,149,084 B2 * 12/2006 Matsushima ......... H10W 40/47 174/15.1
7,318,322 B2 * 1/2008 Ota .................... H05K 7/20781 62/305
9,468,132 B2 10/2016 Taguchi et al.
10,925,190 B2 * 2/2021 Gao ................... H05K 7/20254
12,520,459 B1 1/2026 Gibson
2002/0117291 A1 8/2002 Cheon
2013/0205822 A1 8/2013 Heiland et al.
2025/0063691 A1 * 2/2025 Zhang ................ H05K 7/20327
2025/0338457 A1 * 10/2025 Chen ......................... G06F 1/20

* cited by examiner

*Primary Examiner* — Robert J Hoffberg
(74) *Attorney, Agent, or Firm* — Fish & Richardson P.C.

(57) ABSTRACT

A circuit system includes: a plurality of integrated circuit (IC) chips on a circuit board; a first conduit configured to convey a first flow of a coolant, wherein the first conduit is arranged such that the first flow of the coolant through the first conduit cools the circuit board; a second conduit configured to convey a second flow of the coolant from a common inlet with the first conduit, wherein the second flow bypasses the first conduit; a valve configured to adjust a relative degree of flow of the coolant between the first conduit and the second conduit; and a controller configured to, based at least on data characterizing operation of the plurality of IC chips, control the valve to adjust a first flow rate of the coolant through the first conduit.

18 Claims, 10 Drawing Sheets

COOLANT FLOW CONTROL

CROSS-REFERENCE TO RELATED APPLICATION

This application claims the benefit under 35 U.S.C. § 119(e) of U.S. patent application Ser. No. 19/255,543, filed on Jun. 30, 2025. The entirety of the foregoing application is incorporated herein by reference in its entirety for all purposes.

FIELD OF THE DISCLOSURE

This specification generally relates to coolant flow control for computing systems.

BACKGROUND

A large number of hardware assets (e.g., computers that perform computation tasks for cryptographic operations, such as mining cryptocurrencies, or for artificial intelligence operations such as those involving large language models (LLMs), among other applications) can be aggregated together in a common system.

SUMMARY

Some aspects of this disclosure describe a circuit system. The circuit system includes: a plurality of integrated circuit (IC) chips on a circuit board; a first conduit configured to convey a first flow of a coolant, wherein the first conduit is arranged such that the first flow of the coolant through the first conduit cools the circuit board; a second conduit configured to convey a second flow of the coolant from a common inlet with the first conduit, wherein the second flow bypasses the first conduit; a valve configured to adjust a relative degree of flow of the coolant between the first conduit and the second conduit; and a controller configured to, based at least on data characterizing operation of the plurality of IC chips, control the valve to adjust a first flow rate of the coolant through the first conduit.

This and other circuit systems described herein can have one or more of at least the following characteristics.

In some implementations, the valve is positioned in the second conduit.

In some implementations, the valve is positioned in the first conduit.

In some implementations, the valve includes a binary valve.

In some implementations, the circuit system includes a cold plate that is thermally coupled to the circuit board. The first conduit extends through the cold plate, and the second conduit bypasses the cold plate.

In some implementations, the circuit system includes a flow restrictor configured to restrict the second flow of the coolant through the second conduit.

In some implementations, the flow restrictor is positioned in the second conduit.

In some implementations, the circuit system includes: a third conduit configured to convey a third flow of the coolant from the common inlet, wherein the third flow bypasses the first conduit and the second conduit; and a second valve configured to adjust the first flow rate by adjusting a relative degree of flow between the first conduit, the second conduit, and the third conduit.

In some implementations, the second valve is positioned in the third conduit.

In some implementations, the circuit system includes a second flow restrictor configured to restrict the third flow of the coolant through the third conduit, wherein the second flow restrictor is positioned in the third conduit.

In some implementations, the circuit system includes a power supply unit configured to provide power to the plurality of IC chips; and a third conduit configured to convey a third flow of the coolant to cool the power supply unit, wherein the first flow of the coolant and the second flow of the coolant are from the third conduit.

In some implementations, a second flow rate of the coolant through the third conduit is substantially insensitive to adjustment by the valve.

In some implementations, the circuit system includes a first cold plate that is thermally coupled to the circuit board and a second cold plate that is thermally coupled to the power supply unit. The first conduit extends through the first cold plate, the third conduit extends through the second cold plate, and the second conduit bypasses the first cold plate.

In some implementations, the data characterizing the operation of the plurality of IC chips includes temperature data received from at least one of the plurality of IC chips, wherein the temperature data indicates a temperature of the at least one of the plurality of IC chips. The controller is configured to control the valve based at least on the temperature data.

In some implementations, the controller is configured to control the valve to decrease the first flow rate based at least on the temperature of the at least one of the plurality of IC chips being less than a threshold value.

In some implementations, the controller is configured to: determine a future operational parameter of at least one of the plurality of IC chips; and control the valve based at least on the determined future operational parameter.

In some implementations, the determined future operational parameter includes at least one of: a computation frequency of at least one of the plurality of IC chips, or a power supply voltage of at least one of the plurality of IC chips.

In some implementations, controlling the valve based at least on the determined future operational parameter includes: predicting at least one temperature of the plurality of IC chips based on the determined future operational parameter; and controlling the valve at least based on the predicted at least one temperature.

In some implementations, the circuit system is configured such that a total flow rate of the coolant through the circuit system varies by 20% or less over a full range of settings of the valve.

In some implementations, the plurality of IC chips are configured to perform a common type of computation in parallel with one another.

In some implementations, the common type of computation includes a hash computation or a machine learning computation.

Some aspects of this disclosure describe another circuit system. The circuit system includes a plurality of circuit board systems. Each circuit board system of the plurality of circuit board systems includes: a circuit board, a plurality of integrated circuit (IC) chips on the circuit board, a first conduit configured to convey a flow of a coolant, wherein the first conduit is arranged such that the flow of the coolant through the first conduit cools the circuit board, a valve configured to control a flow rate of the coolant through the first conduit, and a controller configured to, based at least on data characterizing operation of the plurality of IC chips, control the valve to adjust the flow rate. The circuit system further includes a coolant source configured to supply the coolant to the plurality of circuit board systems in parallel.

This and other circuit systems described herein can have one or more of at least the following characteristics.

In some implementations, the controllers of the plurality of circuit board systems are configured to control the valves of the plurality of circuit board systems independently from one another.

In some implementations, each circuit board system of the plurality of circuit board systems includes: a second conduit configured to convey a second flow of the coolant from a common inlet with the first conduit of the circuit board system, wherein the second flow bypasses the first conduit of the circuit board system, wherein the controller of the circuit board system is configured to control the valve to adjust the flow rate by adjusting a relative degree of flow between the first conduit and the second conduit.

Some aspects of this disclosure describe a method that includes: receiving operational data characterizing at least one integrated circuit (IC) chip of a plurality of IC chips on a circuit board; determining a target flow state for a flow of coolant through a first conduit, wherein the flow of the coolant is configured to cool the plurality of IC chips; and adjusting a valve to effect the target flow state, wherein adjusting the valve includes adjusting a relative degree of flow between the first conduit and a second conduit that bypasses the first conduit.

DETAILED DESCRIPTION

Liquid cooling systems may be used for cooling electronic devices. In a liquid cooling system, a working fluid (e.g., a coolant) flows while in thermal contact (e.g., through a heat sink or cold plate) with the electronic devices, drawing heat from the devices and lowering the temperature of the devices. Typically, liquid cooling systems are operated at their maximum capacity (e.g., maximum flow rate), to maintain electronic devices at as low a temperature as possible, e.g., with a target temperature near room temperature.

However, some specialized electronic devices have been found to exhibit improved performance at elevated temperatures. For example, some circuit systems that include multiple integrated circuit (IC) chips on a common circuit board, such as those described below with respect to FIGS. 1-2 and 6-8, may exhibit optimal performance (e.g., higher efficiency such as performing hash operations or LLM token processing at faster rates) at elevated temperatures around 60° C., or in a range thereabout (e.g., in a range from 50° C. to 70° C.). When these circuit systems are powered on, they can warm up based on heat dissipated by their own operation to reach the optimal operating temperature. However, this warming process may be slow due to the presence of a liquid cooling system that is in thermal contact with such a circuit system and drawing heat away from the circuit system. The delay in the warming process due to the presence of the liquid cooling system can result in inhibited system performance while the circuit systems increase in temperature to the optimal operating temperature range. In some cases, dedicated heater(s) may be included to warm the circuit systems upon power on (e.g., during the initial warm up phase). However, these heaters are associated with increased cost, system complexity, and power consumption.

According to some implementations of the present disclosure, a circuit system includes a controller configured to control a valve to adjust a flow rate of a coolant that is used to cool the circuit system. The circuit system can include a circuit board with embedded/mounted IC chips, and the coolant can flow through a cold plate attached to the circuit board. The controller can be configured to selectively throttle (reduce) the coolant flow rate, for example, to increase a system temperature, thereby allowing the circuit system to quickly heat to a target operating temperature. Moreover, as described below, some implementations feature characteristics that improve operation and/or cost of the coolant control, for example, in the context of large numbers of circuit board systems having independent coolant flow control.

Figure 1:
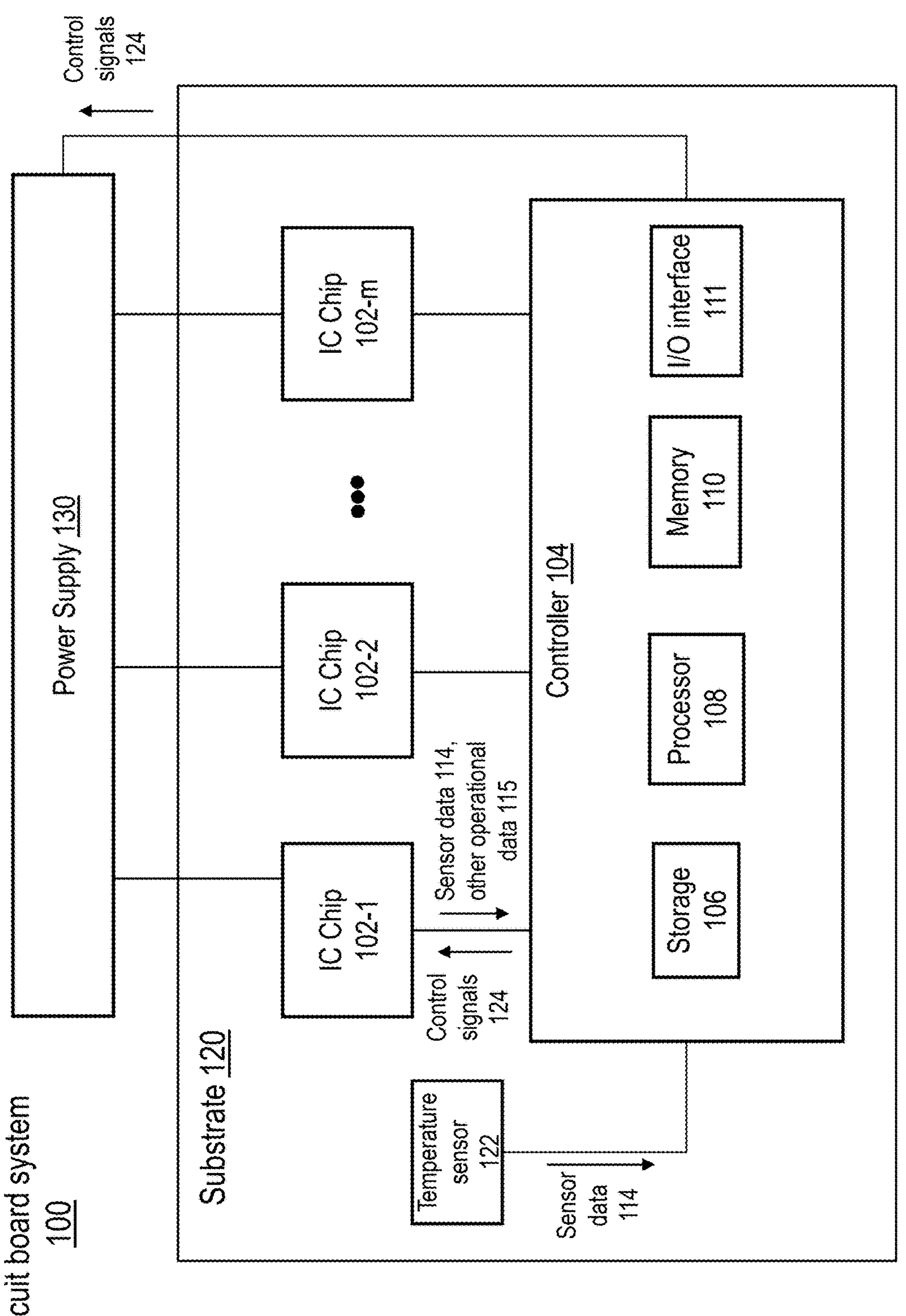
FIG. 1 and FIG. 2 are diagrams illustrating an example of a circuit board system.
Figure 2:
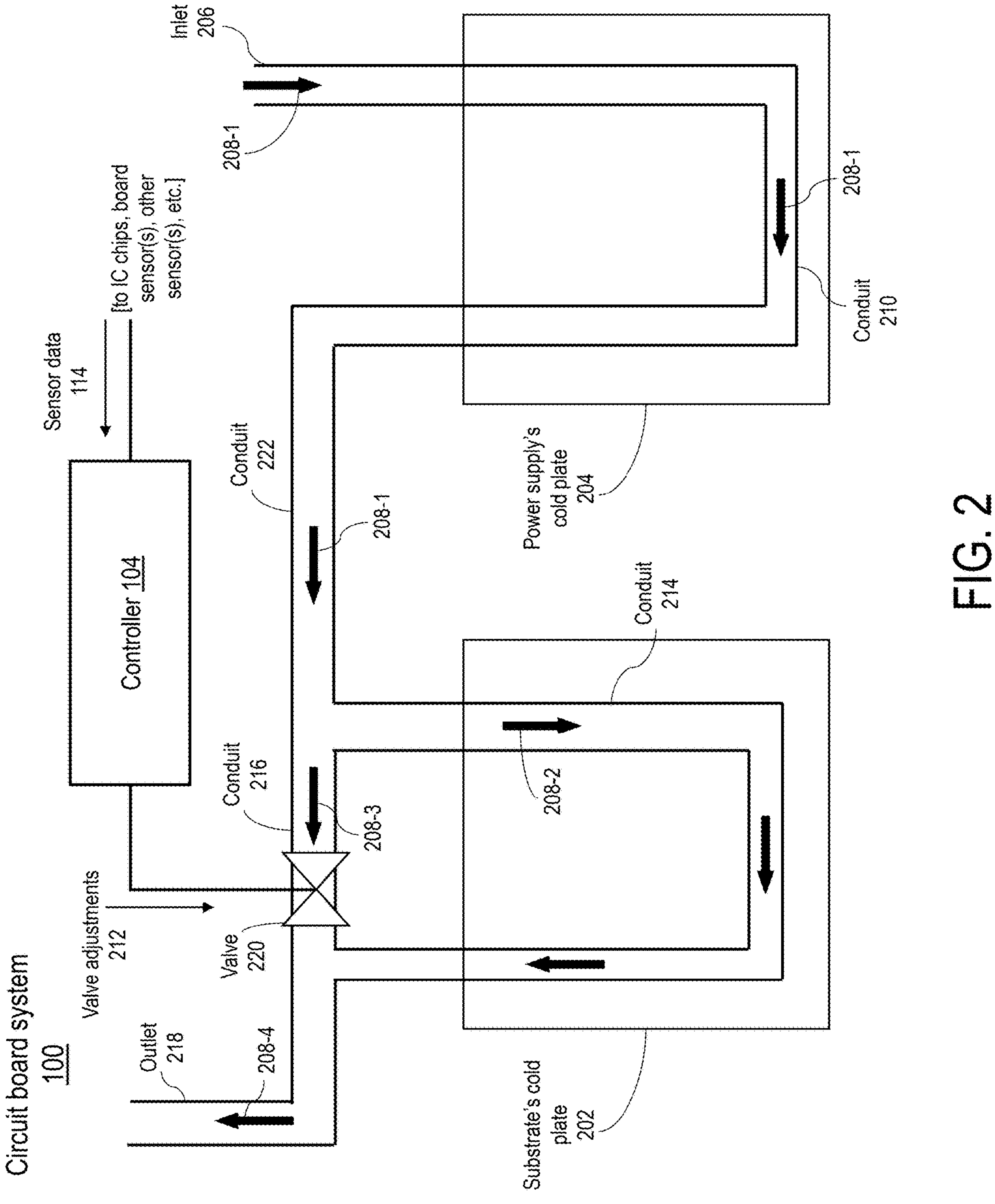

FIG. 1 illustrates an example of a circuit board system 100 (sometimes referred to as a computing device 100 or circuit system 100). For clarity of illustration, FIG. 1 shows electronic and power components of the circuit board system 100, while cooling elements of the circuit board system are shown in FIG. 2. It will be understood that the elements shown diagrammatically in FIGS. 1-2 can coexist in the same circuit board system.

The circuit board system 100 can include multiple IC chips 102-1, 102-2, . . . 102-*m* (referred to collectively as IC chips 102) configured to perform computations in parallel to one another. The circuit board system 100 further includes a controller 104. In some implementations, the circuit board system includes a power supply 130. In some implementations, the power supply 130 is separate from the circuit board system 100. The circuit board system 100 can be referred to as an "asset," e.g., a cryptomining asset (also referred to as a "miner") or a machine learning computation asset.

The IC chips 102 can be, for example, application-specific integrated circuits (ASICs). The IC chip 102 can be of any one or more suitable types in various implementations, such as general-purpose processor chips, field-programmable gate array (FPGA) chips, neural processing units (NPUs), etc. The IC chips 102 can include internal circuitry for executing computations (e.g., computation engines such as hash engines) and for outputting results of the computations. The IC chips 102 can include input and output terminals for receiving power supply voltage(s) and control signals, and for outputting computation results and/or sensor data. The IC chips 102 can include temperature sensors for sensing respective temperatures of the IC chips 102.

In some implementations, the IC chips 102 are arranged on a common substrate 120. The substrate 120 can be, for example, a semiconductor substrate, a dielectric substrate, or a printed circuit board (PCB). The substrate 120 can be referred to as a "board" or "circuit board." The IC chips 102 can be mounted on a common surface of the substrate 120. For example, the IC chips 102 can be mounted on the substrate 120 using a through-hole, surface-mount, or ball-grid array (BGA) mount that electrically couples the IC chips 102 to conductive (e.g., metal) interconnections on and/or in the substrate 120. The substrate 120 can be substantially planar, and the multiple IC chips 102 can be mounted in a common manner on the substantially planar substrate 120, e.g., using a same mounting method on a same mounting surface of an integral portion of the substrate 120. In some implementations, as shown in FIG. 2, the controller 104 is on the substrate 120. For example, the controller 104 can be a distinct computing chip on the substrate 120. In some implementations, the controller 104 can be at least partially on a different substrate or otherwise separate from the substrate 120. For example, the controller 104 can be a distinct electronic circuit component that is communicably coupled to the substrate 120 and the IC chips 102 thereon, either using electrical wiring or wirelessly. In some implementations, the IC chips 102 are on multiple substrates. In some implementations, the IC chips 102 are in a common enclosure, e.g., a common circuit box. In some implementations, the controller 104 (e.g., that is a distinct electronic circuit component) is in the common enclosure with the IC chips 102. In some implementations, the circuit board system 100 includes multiple substrates 120 having respective pluralities of IC chips 102 mounted thereon. The IC chips 102 on the multiple substrates 120 can be controlled by a same controller 104 or by different controllers 104 corresponding to different respective substrates 120. The multiple substrates 120 can be in thermal contact with one or multiple cold plates, e.g., as described in reference to FIG. 8.

The IC chips 102 can be configured to perform computations in parallel with one another. For example, in some implementations, the IC chips 102 are configured to perform a same type of computation in parallel with one another, e.g., based on commands/instructions sent to the IC chips 102 by the controller 104. "Based on" a factor, as used herein, does not preclude the possible inclusion of other factors, e.g., "based on" is equivalent to "based at least on," except where indicated otherwise.

For example, the IC chips 102 can use respective computation engines of the IC chips 102 to, in parallel, execute hash computations (e.g., execute a same hash function algorithm for cryptocurrency mining), execute a same matrix/tensor multiplication process for machine learning, and/or the like. In some implementations, the computations performed by the IC chips 102 are independent of one another. For example, in some implementations, each IC chip 102 can perform its computations based on control by the controller 104, without requiring, for the computations, data or inputs from other IC chips 102. However, joint or mutually-dependent computations are also within the scope of this disclosure.

The controller 104 can include one or more processors 108 (referred to hereafter as processor 108), a storage 106, a memory 110, and one or more I/O interfaces 111 (referred to hereafter as I/O interface 111). For example, the controller 104 can be similar to the computer system 900 described with respect to FIG. 9. The processor 108 can execute instructions stored in the memory 110, and can use the I/O interface 111, to perform operations such as sending instructions, inputs, and the like to the IC chips 102 using control signals 124; receiving outputs and other data from the IC chips 102; sending control instructions to the power supply 130, e.g., to adjust power supplied to the IC chips 102; controlling one or more coolant flow valves (discussed in reference to FIG. 2) and/or communicating with one or more external devices. For example, the controller 104 can receive output data from the IC chips 102, where the output data includes results of the parallel computations performed by the IC chips 102. In some implementations, the control signals 124 include a clock signal, and the controller 104 can adjust a computation frequency of the IC chips 102 by adjusting the clock rate.

The controller 104 can receive sensor data 114 from the IC chips 102. In some implementations, at least one (e.g., each) of the IC chips 102 includes an internal temperature sensor, and the sensor data 114 can include temperature data indicative of internal temperature(s) of the IC chips 102.

The sensor data 114 is an example of operational data 115 characterizing operation of the IC chips 102. Other examples of operational data 115 include computation frequency of the IC chips 102 (e.g., a clock frequency, a hash frequency, a tensor calculation frequency, and/or the like), and/or a supply voltage and/or operating voltage of the IC chips 102. In some implementations, at least some operational data 115 is obtained in a manner besides receiving the operational data 115 from the IC chips 102. For example, the controller 104 can itself set/determine the operational data 115 (e.g., a voltage and/or a computation frequency) and provide corresponding commands to the power supply 130 and/or the IC chips 102, such that the controller 104 has the operational data 115.

In some implementations, the controller 104 receives sensor data 114 from a source distinct from the IC chips 102. For example, a temperature sensor 122 distinct from the IC chips 102 can provide a measured temperature to the controller 104. The measured temperature can indicate, for example, a temperature of the substrate 120 or an ambient temperature around the circuit board system 100.

The power supply 130 can be a single power supply unit or can include two or more distinct power supply modules or devices, e.g., in separate enclosures and/or on separate circuit boards. In some implementations, the power supply 130 includes one or more circuit boards, for example, one or more circuit boards and associated other components (e.g., wiring, cooling unit(s), and/or the like) constituting a power supply unit (PSU). The power supply 130 can be connected to the IC chips 102 and/or the controller 104 by one or more conductive elements, such as power rails, wiring, conductive mounts/standoffs, cables, and/or the like. The power supply 130 can include one or more regulators, rectifiers (e.g., adjustable DC-DC regulators), and/or the like for generating voltages supplied to the IC chips 102 and/or the controller 104. The IC chips 102 and/or the controller 104 can operate based on the supplied voltages.

The IC chips 102, the controller 104, the power supply 130, and elements thereof can be connected together by suitable wires, traces, vias, cables, mounts, and/or the like.

FIG. 1 illustrates the IC chips 102 as being connected in parallel to the power supply 130 and to the controller 104. However, other connection configurations are within the scope of this disclosure. For example, in some implementations, the IC chips 102 have power and/or signal connections in series between one another, e.g., in a "daisy-chain" or "Christmas tree" configuration.

FIG. 2 illustrates coolant flow components of the circuit board system 100. The coolant can be any suitable coolant, including, for example, water or a glycol solution.

As shown in FIG. 2, coolant flows through a first cold plate 204 to cool the power supply 130, and through a second cold plate 202 to cool the substrate 120 on which the IC chips 102 are arranged. The first cold plate 204 is in thermal contact with heat-dissipating and/or hot component(s) of the power supply 130. Accordingly, the conduit 210 is arranged such that the flow 208-1 of the coolant through the conduit 210 cools the power supply 130, e.g., draws heat from component(s) of the power supply 130 that are hotter than the flow 208-1 of the coolant. Similarly, the second cold plate 202 is in thermal contact with (thermally coupled to) the substrate 120 and/or IC chips 102. Accordingly, a conduit 214 through the second cold plate 202 (discussed in more detail below) is arranged such that a flow 208-2 of the coolant through the conduit 214 cools the substrate 120 and/or IC chips 102, e.g., draws heat (directly or indirectly) from the IC chips 102. For example, the second cold plate 202 can be in contact with the substrate 120 and/or IC chips 102. In some implementations, the second cold plate 202 is in contact with a thermal interface material (TIM), such as thermal paste, and the substrate 120 and/or IC chips 102 are in contact with the TIM.

The conduits described herein can include, for example, any suitable pipe, tube, line, hose, duct, hole, tunnel, and/or the like configured to convey a flow of coolant. For example, a conduit through a cold plate, such as conduit 214, can include a tunnel through the cold plate, where outer walls of the conduit are defined by the cold plate. As another example, the conduit can include a pipe/tube extending through a cold plate, e.g., a copper or stainless steel tube extending through an aluminum cold plate. As another example, a conduit between separate components (e.g., between the first cold plate 204 and a second cold plate 202, such as conduits 216 and 222 discussed in more detail below) can include a hose, pipe, and/or the like. A conduit can include multiple distinct portions. For example, a conduit can include a first portion external to a cold plate (e.g., a hose) and a second portion internal to a cold plate (e.g., a tunnel or pipe/tube), and the first portion and the second portion can be sealed to one another to prevent coolant leakage.

The cold plates 202, 204 can include any structure configured for component cooling based on flow of the coolant through and/or in contact with the cold plates 202, 204. That is, the cold plates 202, 204 described herein are not limited to any particular structure or shape and may include, for example, any suitable heat exchanger configured to facilitate heat exchange between the cooled component (e.g., the power supply 130 for the first cold plate 204, or the substrate 120 for the second cold plate 202) and the coolant flowing through cold plate. In some implementations, the cold plates are composed of metal (e.g., aluminum or stainless steel) or another thermally-conductive material. The cold plates 202, 204 can be substantially planar components in physical contact with the cooled components, so that heat is efficiently transferred from the components, to the cold plates 202, 204, and to the coolant.

As shown in FIG. 2, a flow 208-1 of the coolant flows into the circuit board system 100 through an inlet 206. The flow 208-1 proceeds through a conduit 210 through or in thermal contact with a first cold plate 204, to cool the power supply 130. The flow 208-1 then proceeds through a conduit 222 that leads to the second cold plate 202.

FIG. 2 illustrates a configuration in which the coolant flows first to the power supply 130 and then to the substrate 120. In some cases, this ordering may be advantageous. For example, the cooling demands of the substrate 120 may be greater than the cooling demands of the power supply 130. For example, in some cases, heat transfer from the power supply 130 warms the coolant by up to several ° C. (indicating relatively low levels of heat dissipation), while heat transfer from the substrate 120 and IC chips 102 may warm the coolant by more than 10° C. (indicating high levels of heat dissipation). More efficient and effective heat dissipation can be facilitated by first cooling the power supply 130, and then cooling the substrate 120 and IC chips 102.

However, other arrangements are also within the scope of this disclosure. For example, in some implementations, the coolant flows first to the substrate 120, and then to the power supply 130. As another example the coolant can flow in parallel through the substrate 120 and the power supply 130. Moreover, cooling of the power supply 130 by the same coolant as the substrate 120 is not required, and is not included in some implementations. For example, in some implementations, the power supply 130 is cooled by a separate system, e.g., a separate liquid cooling system or an air-cooling system.

Continuing in reference to FIG. 2, in some implementations, the coolant flow 208-1 is split into a flow 208-2 through conduit 214 and a flow 208-3 through conduit 216. The conduit 214 is arranged such that the flow 208-2 through conduit 214 cools the substrate 120 and/or IC chips 102 on the substrate 120. For example, the conduit 214 can be in, on, or otherwise in thermal contact with the second cold plate 202, which is in, on, or otherwise in thermal contact with the substrate 120. The conduit 216 bypasses the conduit 214. The conduit 216 can be arranged such that the coolant flow 208-3 through the conduit 216 cools the substrate 120 and/or IC chips 102 to an extent that is less than the cooling achieved by coolant flow 208-2 through the conduit 214. For example, the conduit 216 can bypass the second cold plate 202, such that the coolant flow 208-3 does not contribute substantially (or at all) to cooling the substrate 120 and/or IC chips 102. For example, a length of extension of the conduit 216 through and/or on the second cold plate 202 can be less than a length of extension of the conduit 214 through and/or on the second cold plate 202. Accordingly, by adjustment of the relative flow between the conduit 214 and the conduit 216, a degree of cooling of the substrate 120 and/or IC chips 102 can be controlled.

In some implementations, as shown in FIG. 2, a valve 220 is configured to control a flow rate of the coolant through the conduit 216. The controller 104 can control the flow rate by adjusting the open or closed state of the valve 220. When the valve 220 is closed or mostly closed, flow of the coolant through conduit 216 (coolant flow 208-3) is mostly blocked, causing most of the coolant to flow through conduit 214 (coolant flow 208-2). However, when valve 220 is open or mostly open, a greater portion of the coolant flows through the conduit 216, such that the amount of coolant flowing through conduit 214 is less in comparison. Accordingly, when the valve 220 is closed or mostly closed, a flow rate of the coolant through conduit 214 (coolant flow 208-2) is higher, compared to the case when the valve 220 is open or mostly open. For example, when the valve 220 is closed, all the coolant (e.g., 100%) flows through conduit 214; when the valve 220 is open, an intermediate level of the coolant flow is diverted through conduit 216, leaving the remaining portion of the coolant to flow through conduit 214 and through the cold plate 202. For example, when the valve 220 is open approximately half of the coolant flow may be diverted through conduit 216, leaving the remaining half to flow through conduit 214 and through the cold plate 202 (though the flow division is not limited thereto). By causing the flow rate of the coolant through the conduit 214 to decrease by opening the valve 220, the rate of cooling of the substrate can be lowered. As such, the degree of cooling of the substrate 120 and/or IC chips 102 can be controlled by adjustment of the valve 220.

The controller 104 can provide signals 212 to the valve 220 to control the state of the valve, e.g., a level of openness/closedness of the valve 220. The signals 212 can be, for example, analog electrical signals, digital electrical signals, and/or any other suitable type of signal. Description of examples of how the controller 104 determines the adjustments is provided below in reference to FIGS. 5A to 5C. Although the controller 104 is illustrated as both providing control signals 124 to the IC chips 102 and providing signals 212 to the valve 220, in some implementations, component(s) performing these functions are at least partially distinct. For example, a first computing device can control the IC chips 102, and a second computing device can control the valve 220. Except if noted otherwise, a "controller" can include multiple distinct computing devices without departing from the scope of this disclosure.

The valve 220 can be any suitable type of fluid control valve. For example, the valve 220 can be a continuous valve capable of continuous or near-continuous control of the flow through the conduit 216, or can be a valve with discrete settings for control of the flow. For example, in some implementations, the valve 220 is a binary valve that is either closed or open. The valve 220 can be, for example, a ball valve, a butterfly valve, a gate valve, or any other suitable type of valve. The valve 220 can be an electrically-controlled valve, e.g., a motorized ball valve, a solenoid valve, etc.

In some implementations, the valve 220 is on the conduit 216, as shown in FIG. 2. In some implementations, the valve 220 is on the conduit 214. In some implementations, the valve 220 is at a junction between the conduit 214 and the conduit 216, e.g., so as to control relative flow between the conduits 214, 216 by controlling in-flow of the coolant into each of the conduits 214, 216.

The coolant flows 208-2, 208-3 are recombined into an outlet flow 208-4 that exits the circuit board system 100 through an outlet 218.

Based on coolant control configuration of FIG. 2, and other coolant control configurations described herein, coolant flow to cool the substrate 120 and/or IC chips 102 can be controlled, thereby adjusting the rate or degree of cooling of the substrate 120 and/or IC chips 102. This control can be used to cause the circuit board system 100 and/or components thereof (e.g., the IC chips 102) to reach elevated target temperatures in less time. For example, in contrast to systems in which circuit components are cooled substantially as much as possible, in the circuit board system 100, coolant flow to cool the IC chips 102 can be selectively throttled to intentionally cause the IC chips' temperature to increase more rapidly.

Figure 4:
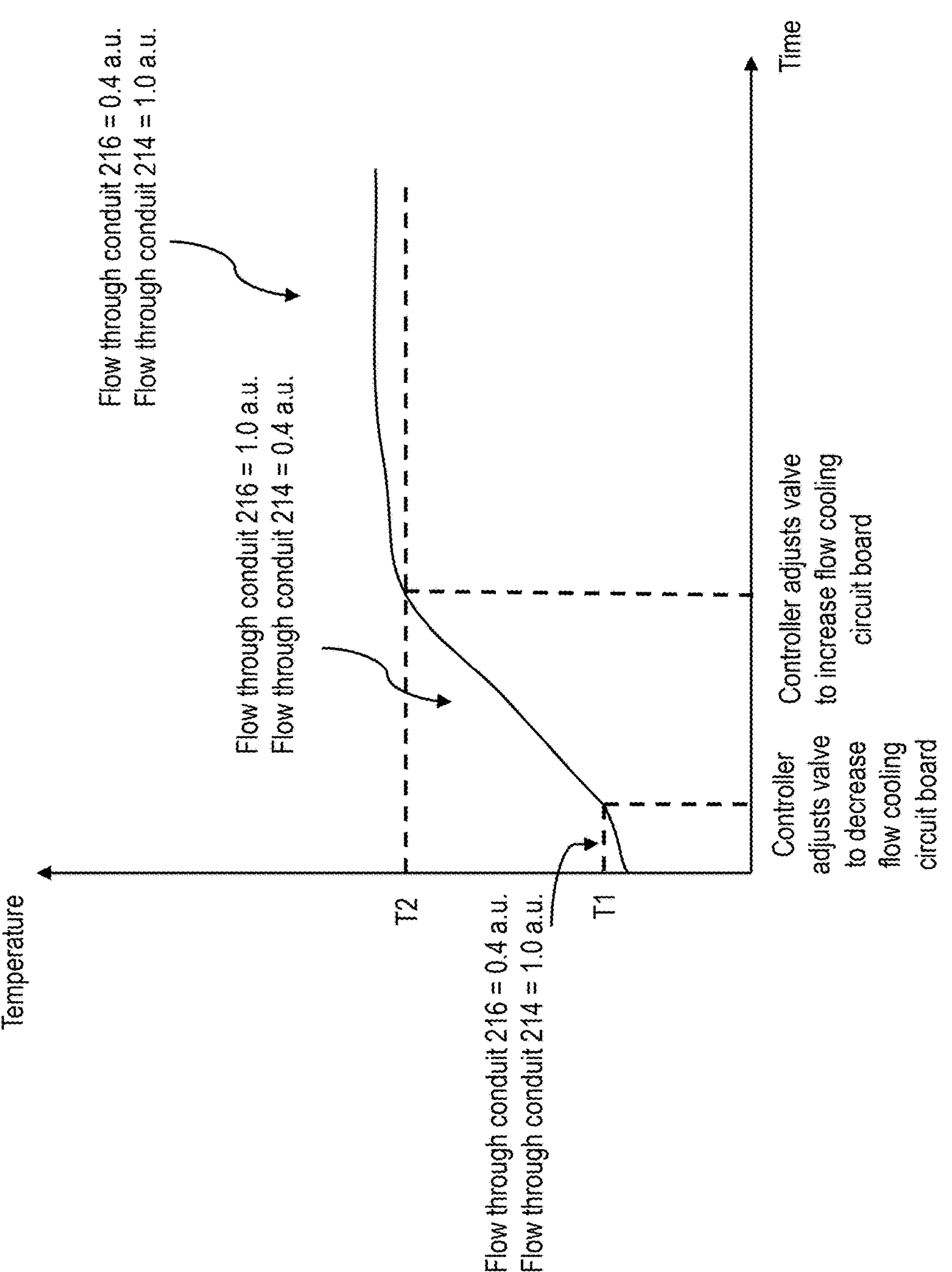
FIG. 4 is a graph illustrating an example of temperature over time.

For example, when the IC chips 102 are relatively cold (e.g., less than a threshold temperature), the valve 220 can be controlled to cause a relatively high coolant flow rate through 216 and a relatively low flow rate through conduit 214. An example of this control is shown in FIG. 4, a plot of temperature (e.g., a temperature of one or more IC chips 102) over time. At a first time, when the temperature is T1, the controller 104 determines that the temperature T1 is less than a target temperature range, e.g., less than a threshold temperature T2. Based on this, the controller 104 determines that fluid flow cooling the substrate 120 (circuit board) should be throttled, and the controller 104 controls the valve to throttle the fluid flow. For example, the controller 104 can provide signals 212 to the valve 220 to cause the flow rate through conduit 216 to be 1.0 absolute units (a.u.) (an increase from a prior flow rate of 1.0 a.u.), and to cause the flow rate through conduit 214 to be 0.4 a.u (a decrease from a prior flow rate of 1.0 a.u.). As a result of the comparatively low flow rate through conduit 214, the IC chips 102 can increase in temperature based on decreased cooling capacity. For example, as shown in FIG. 4, prior to this change, the rate of temperature increase is smaller than after the change; the difference is due to the throttling of coolant flow after the valve adjustment.

As shown in FIG. 4, based on the IC chips 102 being in a target temperature range (e.g., at or above the threshold temperature T2), at a second time, the controller 104 adjusts the valve to increase the fluid flow cooling the circuit board. For example, the controller 104 can provide signals 212 to the valve 220 to cause the flow rate through conduit 216 to be decreased to 0.4 a.u., and to cause the flow rate through conduit 214 to be increased to 1.0 a.u. As a result, the IC chips 102 are cooled to prevent their temperature from exceeding a target range.

It will be understood that the relative flow rates shown in FIG. 5 are examples, and that other relative flow rates are also within the scope of this disclosure.

The configuration shown in FIG. 2, and other bypass-based configurations described throughout this disclosure, can provide advantages for fluid regulation. In the circuit board system 100 of FIG. 2, coolant flow can remain unchanged for conduit 210 while selectively bypassing the conduit 214. For example, in some implementations, the total coolant flow rate can advantageously be substantially constant, or change only by a limited amount (e.g., by 10% or 20% or less) regardless of a state of the valve 220, e.g., over a full range of settings of the valve 220. Accordingly, the power supply 130 can be adequately cooled even if the cooling rate of the substrate 120 is reduced.

In the absence of a bypass arrangement (e.g., in the absence of conduit 216), throttling the coolant flow 208-2 may significantly throttle the total flow rate through the circuit board system 100. For example, in the absence of a bypass arrangement, if the coolant flow 208-2 were reduced by 50%, the coolant flow entering and leaving the circuit board system 100 may also be reduced by 50%. This may significantly reduce the coolant flow cooling the power supply 130, decreasing the effectiveness of cooling the power supply 130 and in some cases leading to undesired outcomes, e.g., a high temperature condition in the power supply 130. However, based on bypass configurations such as that shown in FIG. 2, a flow rate of coolant that cools the power supply 130 can be substantially insensitive to adjustment by the valve 220, e.g., the flow rate of the flow 208-1 can be substantially constant regardless of a state of the valve 220. In some implementations, the flow rate of the flow 208-1 (that is, the total flow rate through the circuit board system 100) varies by less than 10% or less than 20% regardless of a state of the valve 220, e.g., over a full range of settings of the valve 220. Moreover, high throttling of the total coolant flow may lead to undesired backpressure on a source supplying the coolant, as described in reference to FIG. 3 below.

However, some implementations according to the present disclosure include throttling of total flow, e.g., total coolant flow that changes, or can be changed, significantly based on adjustment of one or more valves, which may be—though need not be—distinct from valve(s) that control a degree of cooling using a bypass configuration.

Figure 3:
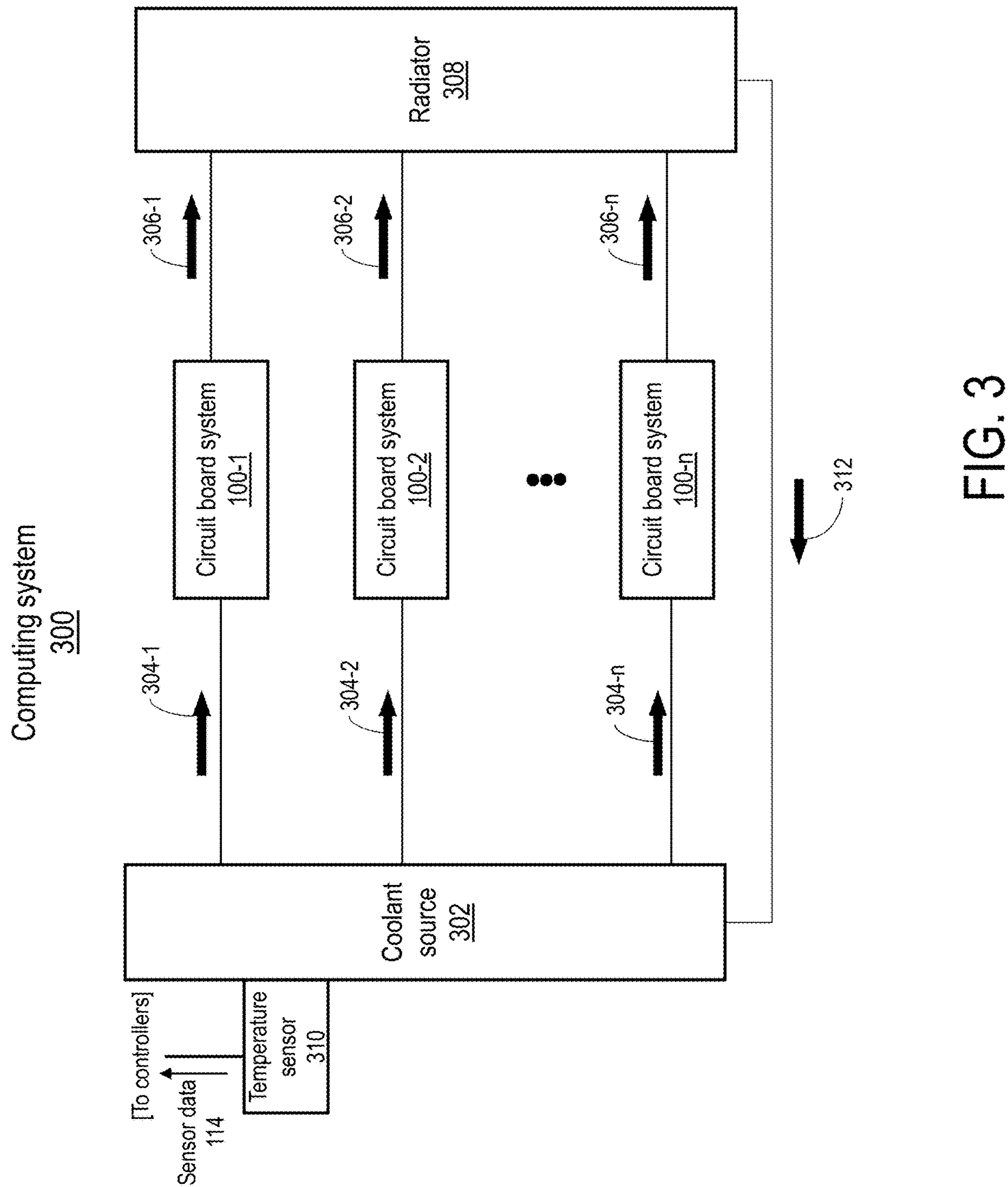
FIG. 3 is a diagram illustrating an example of a computing system.

FIG. 3 illustrates an example of a computing system 300 (sometimes referred to as a circuit system 300) including multiple circuit board systems 100-1, 100-2, . . . 100-$n$ (referred to collectively as circuit board systems 100). n may be, for example, on the order of 100, but is not limited thereto. Each of the circuit board systems 100 can have characteristics as described for the circuit board system 100 of FIGS. 1 and 2, and/or as described for other examples of circuit board systems provided herein, e.g., circuit board systems 600, 700, and 800. The computing system 300 may correspond, for example, to a computing center or a portion thereof, in which many circuit board systems 100 are aggregated for large-scaling computing.

The computing system 300 includes a coolant source 302 configured to provide respective coolant flows 304-1, 304-2, . . . , 304-$n$ (referred to collectively as coolant flows 304) to the circuit board systems 100, e.g., in parallel with one another. These inflows 304 can be, for example, the coolant flow 208-1 shown in FIG. 2. Further, respective coolant outflows 306-1, 306-2, . . . 306-$n$ (referred to collectively as coolant flows 306) flow from the circuit board systems 100 to a heat exchanger 308. These outflows 306 can be, for example, the coolant flow 208-4 shown in FIG. 2. The heat exchanger 308 can be configured to cool the coolant, heated by the circuit board systems 100, through thermal exchange with an environment, e.g., an outside ambient environment. For example, the heat exchanger 308 can include a "dry cooler," a combination of a radiator and a fan that cool the coolant, exchanging heat with ambient air. As another example, the heat exchanger 308 can include a chiller, a refrigeration unit which cools the coolant through a suitable refrigeration method. A return flow 312 of the coolant from the heat exchanger 308 to the coolant source 302 can provide a closed-loop configuration of coolant flow.

In some implementations, at least some of the circuit board systems 100 are configured to perform their own coolant flow control, independently from coolant flow control of other circuit board systems 100. For example, the controller 104 of each circuit board system 100 can adjust the valve 220 of the circuit board system 100 based on data characterizing operation of the IC chips 102 of the circuit board system 100. As such, the circuit board system 100-1 may adjust the flow rate through a given conduit (e.g., conduit 214) to be different from the flow rate through the same conduit in circuit board system 100-2, e.g., based on different data characterizing operation of the IC chips 102 between the two circuit board systems 100-1, 100-2. This can provide more fine-grained control than if flow rate were controlled uniformly for all the circuit board systems 100, resulting in improved, more-optimized temperature control by control of coolant flow rate.

In some implementations, the coolant source 302 includes one or more pumps configured to push the coolant flows 304, 306, 312 through the computing system 300. If flow through the circuit board systems 100 is significantly attenuated (e.g., if a significant portion of the circuit board systems 100 significantly throttle their overall through-flow), a significant back-pressure may occur on the pumps, potentially damaging the pumps and/or otherwise degrading their operation. However, bypass configurations, such as that shown in FIG. 2, permit coolant flow that cools the substrates 120 and/or IC chips 102 of the circuit board systems 100 to be significantly throttled, while the total coolant flow through the circuit board systems 100 is less throttled or remains substantially constant. Accordingly, damage to pumps of the coolant source 302 can be substantially prevented.

FIG. 3 further illustrates the presence of a temperature sensor 310. The temperature sensor 310 can be configured to sense a temperature of the coolant (e.g., in or in proximity to the coolant source 302) and provide an indication of the sensed temperature to the controllers 104 of the circuit board systems 100 as sensor data 114. In some implementations, the controllers 104 are configured to use the temperature sensed by the temperature sensor 310 to perform valve control, e.g., as described in reference to FIG. FIGS. 5A to 5C. Other or additional temperature sensors 310 may be included in the computing system 300. For example, in some implementations, a temperature sensor 310 is configured to sense a temperature of the coolant in or in proximity to the heat exchanger 308.

Various methods can be used by the controller 104 to determine settings/adjustments to be made to the valve 220. In some implementations, as described above in reference to FIG. 4, the controller 104 can control the valve 220 to set/adjust a flow cooling the substrate 120 and/or IC chips 102 based on sensed temperatures of the sensor data 114.

Figure 5A:
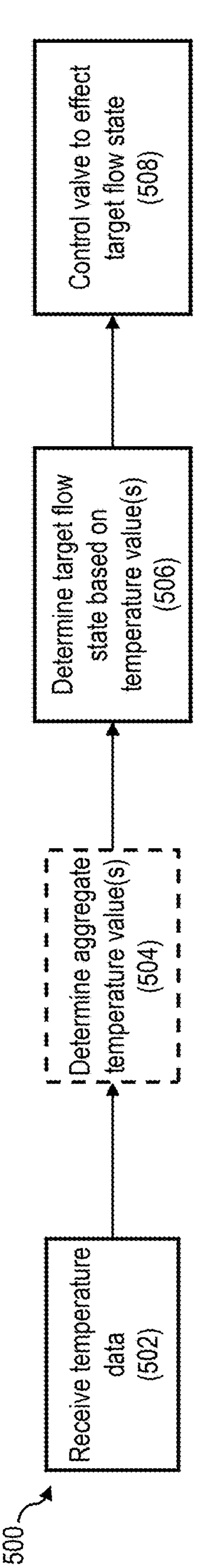
FIGS. 5A-5C are diagrams illustrating examples of control processes.

For example, as shown in FIG. 5A, a process 500 (e.g., performed by the controller 104) includes receiving temperature data (502), e.g., temperature data of the sensor data 114. For example, the temperature data can indicate internal temperature(s) of the IC chips 102, a temperature of the substrate 120 provided by sensor 122, and/or another temperature, e.g., of the coolant and/or an ambient temperature, provided by sensor 310 and/or another sensor.

In some implementations, one or more aggregate temperature value(s) are determined based on the temperature data (504). For example, the aggregate temperatures can include an average temperature of the IC chips 102, a weighted average of IC chip temperature(s) and a substrate temperature, and/or the like. In some implementations, operation 504 is not performed, and subsequent control can be performed based on as-received temperature values.

A target flow state is determined based on one or more temperature values (506). The temperature values can include, for example, temperature values received in operation 502 and/or aggregate temperature values determined in operation 504.

A flow state can include, for example, state(s) of one or more valves, and/or coolant flow rate(s) through one or more conduits. Determining the target flow state can include selecting between a plurality of flow states having different respective flow rates for a flow configured to cool the substrate 120 and/or IC chips 102. For example, determining the target flow state can include selecting between a high-flow state (higher cooling capacity) and a low-flow state (lower cooling capacity). As another example, determining the target flow state can include selecting between a high-flow state (high cooling capacity), a medium-flow state (medium cooling capacity), and a low-flow state (low cooling capacity). Determining the target flow state need not (though may) include a determination of a particular target flow rate or other fluid flow parameter. For example, determining the target flow state can include determining a target valve state, e.g., closed, open, or set to a particular configuration. It will be understood that the target valve state is equivalent to a flow state that results from the valve having the target valve state.

In some implementations, the target flow state is determined based on whether the one or more temperature values satisfy a condition. For example, if a temperature value is in a target range, a first flow state can be determined, and, if the temperature value is out of the target range, a second, different flow state can be determined.

For example, if a temperature (e.g., an IC chip temperature or an average temperature of the IC chips) is less than a threshold value, a first flow state can be determined as the target flow state. If the temperature is at least the threshold value, a second flow state can be determined as the target flow state. In the first flow state, a flow rate for a flow configured to cool the substrate 120 and/or IC chips 102 is less than for the second flow state. This example corresponds to that described for FIG. 4, in which flow through conduit 214 is throttled when the temperature is less than T2, compared to when the temperature is at least T2.

Other temperature-based determinations are also within the scope of this disclosure. In some implementations, the target flow state is determined based on a rate of change of one or more temperature values. For example, if a rate of increase of a temperature value is less than a threshold value (corresponding to slower heating of the circuit board system 100 than desired), the controller 104 can determine a flow state corresponding to decreased/throttled flow. As another example, if a rate of increase of a temperature value is greater than a threshold value (corresponding to rapid heating that may damage the circuit board system 100), the controller 104 can determine a flow state corresponding to a high flow rate, e.g., unthrottled flow (e.g., can close the valve 220 in FIG. 2 to direct all flow through conduit 214).

As another example, determining the target flow state can include applying a control algorithm, such as a proportional-integral-derivative (PID) algorithm, based on one or more temperature values. For example, the PID algorithm can be applied based on a target temperature value or a target rate of temperature change.

The valve is controlled to effect the target flow state (508). For example, the controller 104 can provide signals 212 to the valve 220, to cause the valve 220 to have a target valve state determined in operation 506, or to cause the valve 220 to have a state that corresponds to a target flow configuration determined in operation 506. For example, in the case of a binary valve 220, the controller 104 can provide a close signal or an open signal to the valve 220. In the case of a continuously-adjustable valve 220, the controller 104 can provide a signal indicative of a target setting to the valve 220.

Figure 5B:
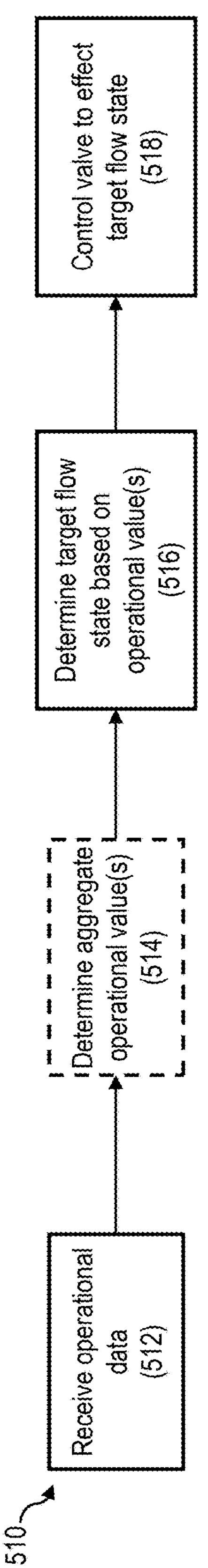

FIG. 5B illustrates another example of a process 510 that can be used to control coolant flow. Process 510 is substantially similar to process 500, and overlapping description thereof is omitted. In process 510, one or more other types of operational data may be used, instead of or in addition to temperature data (which is itself an example of operational data) to perform the control.

In the process 510, operational data is received (512). Besides the possible inclusion of temperature data as discussed in reference to operation 502, the operational data may include, for example, a computation frequency, a supply voltage, and/or operating voltage of one or more IC chips 102; an active/standby or on/off state of one or more IC chips 102; an uptime of one or more IC chips 102 and/or of the circuit board system 100; a failure state of one or more IC chips 102 and/or of the circuit board system 100; and/or any other suitable type of operational parameter.

In some implementations, one or more aggregate operational values may be determined (514), e.g., as averages, weighted averages, and/or other combinations of values of the operation data.

A target flow state is determined based on one or more operational values (516). Operation may be based on threshold and/or target temperatures (as discussed in reference to operation 506) and may additionally be based on one or more other types of operational data. For example, if a temperature or rate of temperature increase is less than a threshold value and a computation intensity is low (e.g., a computation frequency and/or supply voltage is less than a threshold), the target flow state may correspond to a high flow rate to cool the substrate 120 and/or IC chips 102, because heat dissipation may be relatively low, and heating will be expected as computation intensity increases. However, if the temperature or rate of temperature increase is less than the threshold value and the computation intensity is high, the target flow state may correspond to a more-throttled flow rate to cool the substrate 120 and/or IC chips 102, because the temperature or rate of temperature increase is still low despite high levels of heat dissipation, corresponding to too-high cooling capacity.

As another example, a threshold rate of temperature increase, below which cooling flow is throttled, may be lower when fewer IC chips 102 in the circuit board system 100 are actively performing computing operations (e.g., in an active state), corresponding to a lower expected rate of heat dissipation.

It will be understood that various other determination criteria can be used in operation 516, based on individual and/or joint consideration of any one or more of the operational data.

The valve is controlled to effect the target flow state (518), as discussed in reference to operation 508.

Figure 5C:
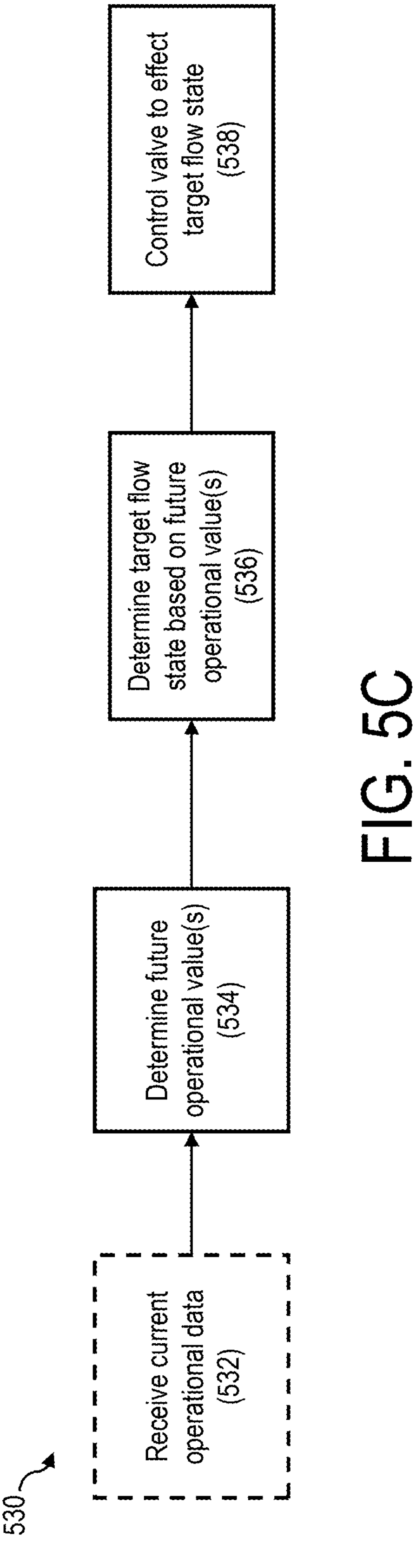

In some implementations, flow control is performed at least partially based on planned/predicted changes in circuit board system operation. FIG. 5C illustrates an example of such a process 530, for example, performed by the controller 104.

In the process 530, in some implementations, current operational data may be received (532), e.g., as described in reference to operations 502 and 512. The current operational data can indicate a current state of the circuit board system 100.

One or more future operational values are determined (operation 534). For example, operation 534 can correspond to the controller 104 determining operational parameters for the IC chips 102 pursuant to the controller's 104 control of the IC chips 102. For example, the controller 104 can determine to increase or decrease a computation frequency of the IC chips 102 by increasing or decrease a clock frequency, a hash frequency, a tensor calculation frequency, and/or the like. As another, the controller 104 can increase or decrease a power supply voltage of the IC chips 102. The controller 104 can cause the IC chips 102 to operate in accordance with the determined future operational values by providing corresponding control signals 124 to the IC chips 102 and/or the power supply 130. These and/or other operational values (e.g., a number of the IC chips 102 performing computation, when the controller determines to enable or disable computation by one or more of the IC chips 102) are expected to affect heat dissipation by the circuit board system 100.

As shown in FIG. 5C, based on the one or more future operational values, and in some cases based on current operational data received in operation 532, a target flow state is determined (536). For example, in some implementations, based on the future operational values corresponding to an increase in computation intensity—and an associated increase in heat dissipation—the controller 104 can determine a target flow state that decreases an extent of throttling (e.g., causes an increase in coolant flow that cools the substrate 120 and/or IC chips 102) compared to a current state. Accordingly, the controller 104 can cause the circuit board system 100 to "prepare" for an expected increase in heat dissipation by increasing cooling capacity. Conversely, in some implementations, based on the future operational values corresponding to a decrease in computation intensity—and an associated decrease in heat dissipation—the controller 104 can determine a target flow state that increases an extent of throttling (e.g., causes an decrease in coolant flow that cools the substrate 120 and/or IC chips 102) compared to a current state. Accordingly, the controller 104 can prevent over-cooling of the circuit board system 100 by decreasing cooling capacity, in expectation of future reduced heat dissipation.

In some implementations, the determination in operation 536 is based on the current operational data. For example, the determination can be based on one or more future operational values and on one or more current temperatures received as sensor data 114. For example, based on the future operational values and the current temperatures, the controller 104 can predict one or more temperatures and determine the target flow state based on the predicted temperatures, e.g., as described for operation 506. The predicted temperatures can correspond to predicted temperatures of the circuit board system 100 after the future operational values are implemented by the circuit board system 100. To predict the one or more temperatures, the controller 104 can: apply a predetermined function stored on the controller 104, where the function takes the future operational values and the current temperatures as inputs as outputs the predicted temperatures; use a lookup table on the controller 104, where the controller maps between (i) future operational values and current temperatures and (ii) predicted temperatures; and/or apply any other suitable method.

Referring again to FIG. 5C, the method 530 includes controlling the valve to effect the target flow state, e.g., as described in reference to operation 508.

Although FIGS. 5A to 5C refer to a single valve, in some implementations, a circuit board system includes multiple valves, and operations 508, 518, and 538 can include controlling one or more of the multiple valves. For example, FIGS. 6 and 7 illustrate examples of circuit systems having multiple coolant flow control valves.

Figure 6:
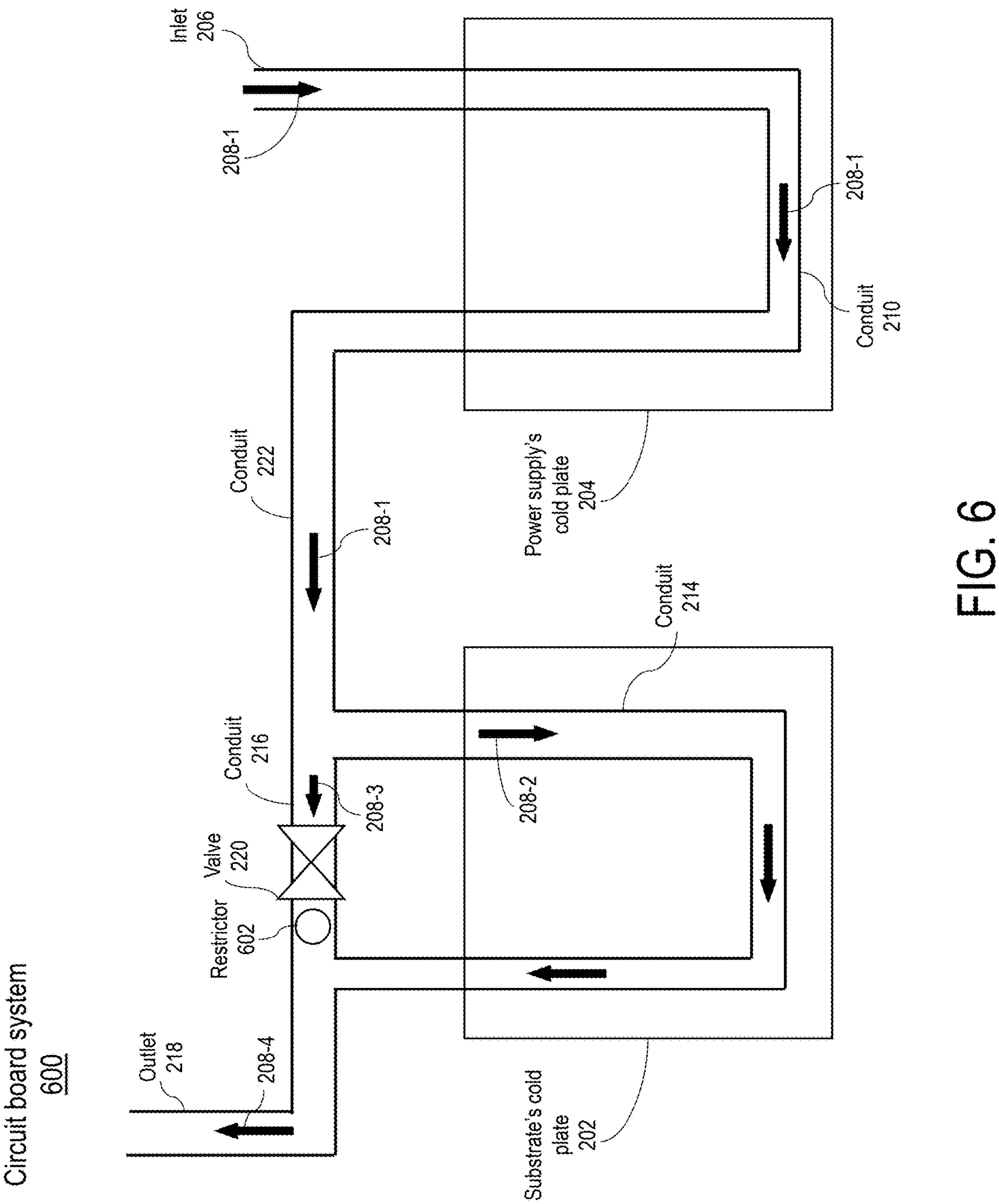
FIG. 6 is a diagram illustrating an example of a circuit board system.
Figure 7:
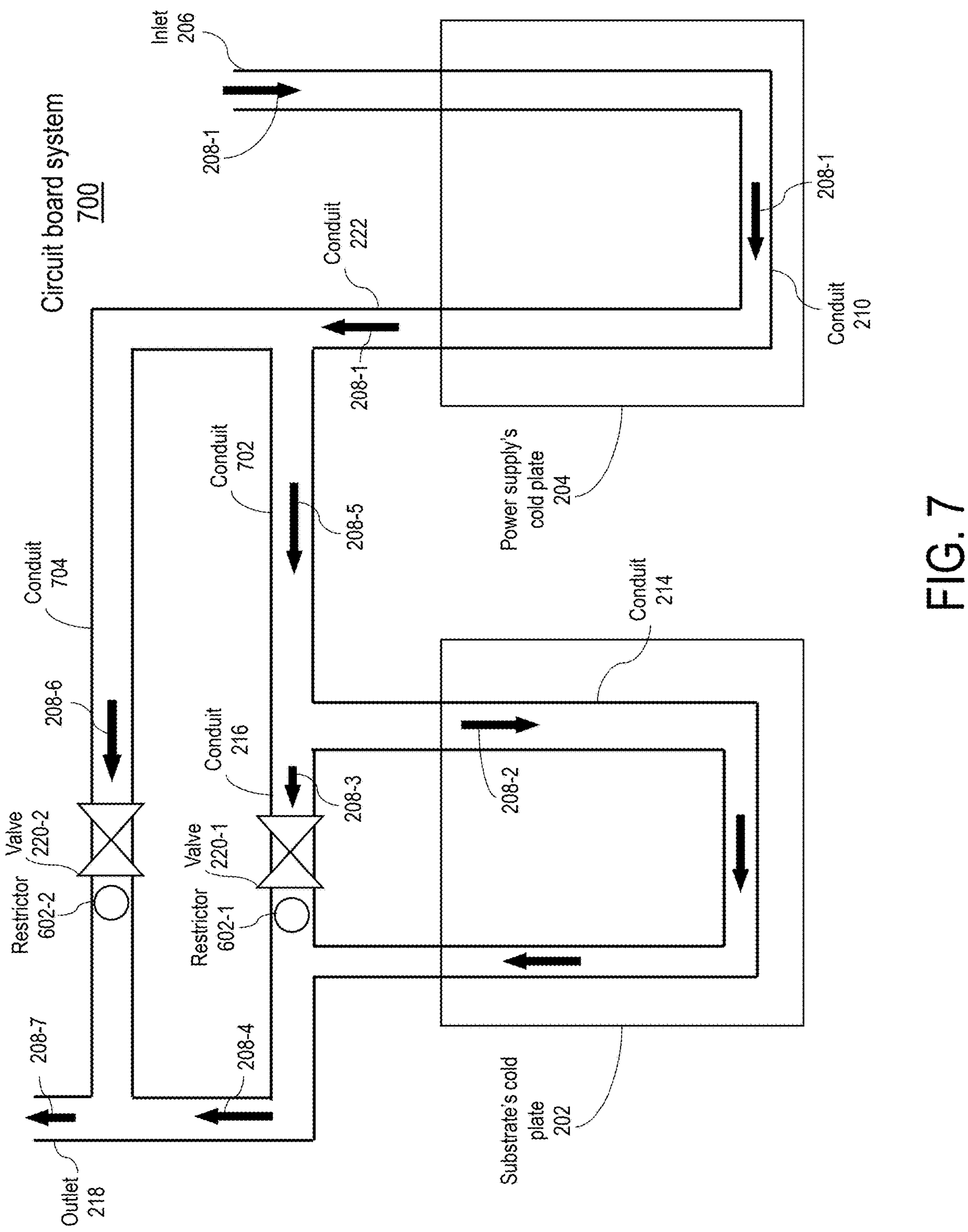
FIG. 7 is a diagram illustrating an example of a circuit board system.

FIG. 6 illustrates a coolant flow configuration of another example of a circuit board system 600. The circuit board system 600 is similar to the circuit board system 100, and the description provided for the circuit board system 100 and components thereof can equally be applied to the circuit board system 600 and components thereof, except where noted otherwise or indicated otherwise by context. Moreover, the circuit board system 600 can be used as the circuit board system 100 in descriptions herein, e.g., in the computing system 300 and in the processes 500, 510, 530.

Compared to the circuit board system 100 illustrated in FIG. 2, the circuit board system 600 additionally includes a restrictor 602 (or flow limiter) configured to restrict the coolant flow 208-3 through conduit 216, that is, the coolant flow that bypasses or substantially bypasses the second cold plate 202. For example, the restrictor 602 can be positioned in conduit 216. The restrictor 602 can be configured to act as a barrier to partially block the coolant flow 208-3. For example, restrictor 602 can be configured to reduce a cross-sectional area for the coolant flow 208-3, thereby reducing the flow rate of the coolant flow 208-3. For example, the restrictor 602 can include a member that fills a cross-section of the conduit 216 and includes one or more holes having a smaller total cross-sectional area than a cross-sectional area of the conduit 216.

Based on the inclusion of the restrictor 602, in some implementations, the valve 220 can be a binary valve, e.g., an on/off valve that is either fully closed or fully open, such as a solenoid valve. In some cases, in the absence of the restrictor 602, if the valve 220 were fully open, all or nearly all coolant might bypass conduit 214, leading to insufficient cooling capacity. For example, conduit 214 may present a higher barrier to flow than conduit 216, such that the coolant strongly preferentially flows through conduit 216 if the valve 220 is open. However, the restrictor 602 can be configured such that a target flow rate occurs through conduit 214 even when valve 220 is open. For example, in some implementations, the restrictor 602 is configured such that a flow rate through conduit 214 when valve 220 is open is in a range from 20% to 80% of a flow rate through conduit 214 when valve 220 is closed.

The use of a binary valve as valve 220 can be advantageous for decreasing the cost of the circuit board system. Non-binary valves may be prohibitively expensive when deployed at scale. For example, a computing center may have thousands of circuit board systems, each with at least one such valve. The inclusion of the restrictor 602 allows a less-expensive binary valve to be used to decrease cost while retaining target flow characteristics.

However, it will be understood that binary valves can be used even in the absence of a restrictor, e.g., based on a suitable configuration of the conduits 214, 216 to provide for a target flow rate through conduit 214 even when the valve 220 is open. Moreover, in some implementations, the restrictor 602 can be included in conjunction with a valve 220 having three or more states corresponding to different levels of coolant flow, e.g., a continuously-adjustable valve.

FIG. 7 illustrates a coolant flow configuration of another example of a circuit board system 700. The circuit board system 700 is similar to the circuit board systems 100 and 600, and the description provided for the circuit board systems 100, 600 and components thereof can equally be applied to the circuit board system 700 and components thereof, except where noted otherwise or indicated otherwise by context. Moreover, the circuit board system 700 can be used as the circuit board system 100 in descriptions herein, e.g., in the computing system 300 and in the processes 500, 510, 530.

As shown in FIG. 7, the circuit board system 700 includes two conduits 216 and 704 that bypass conduit 214 (e.g., bypassing the second cold plate 202). Coolant flow 208-1 from the inlet 206 (e.g., from the first cold plate 204) is split into conduit 702 (flow 208-5) and conduit 704 (flow 208-6). Coolant flow 208-5 is split into conduits 214, 216 as described in reference to FIGS. 2 and 6. Coolant flows 208-2, 208-3, 208-6 recombine as an outflow 208-7 through outlet 218.

Conduit 704 provides an additional flow path for coolant to bypass conduit 214. The circuit board system 700, in addition to the valve 220 (here labeled as valve 220-1), can include a second valve 220-2 configured to control coolant flow through conduit 704. The circuit board system 700, in addition to the restrictor 602 (here labeled as restrictor 602-2), can include a second restrictor 602-2 configured to restrict coolant flow through conduit 704.

Although not illustrated in FIG. 7 for clarity, it will be understood that the valves 220-1, 220-2 can each be configured to receive control signals/adjustments from a controller 104.

The conduit configuration of FIG. 7 allows switching between more than two coolant flow states even when the valves 220-1, 220-2 are binary valves. For example, when determining target flow states (e.g., operations 506, 516, 536), the controller can select between three or more flow states. A first flow state can correspond to valves 220-1, 220-2 both being closed, such that all coolant flow is provided through conduit 214. A second flow state can correspond to valve 220-1 being open and valve 220-2 being closed. In that case, an intermediate flow rate may pass through conduit 214, e.g., 33% of the flow rate in the first flow state. A third flow state can correspond to valve 220-1 being closed and valve 220-2 being open. In that case, an intermediate flow rate may pass through conduit 214, e.g., 66% of the flow rate in the first flow state. A fourth flow state can correspond to valves 220-1, 220-2 both being open, corresponding to a low flow rate through conduit 214, e.g., a maximum level of bypass of conduit 214. Configuring conduits 216, 704 and/or restrictors 602-1, 602-2 such that flow through conduits 216, 704 encounters different flow resistances (that is, an asymmetry between the conduits 216, 704) can provide for a difference, in flow rate through conduit 214, between the second and third flow states. In some implementations, the second and third flow states correspond to a same flow rate through conduit 214.

Accordingly, a circuit board system including binary coolant flow valves can be switched between three or more states by providing two or more bypass flow paths. In some implementations, at least one of the valves 220-1, 220-2 is switchable between three or more states. In some implementations, at least one of the restrictors 602-1, 602-2 is not present. Moreover, it will be apparent that the configuration of FIG. 7 can be extended to three or more bypass flow paths to provide even finer-grained control over coolant flow.

Figure 8:
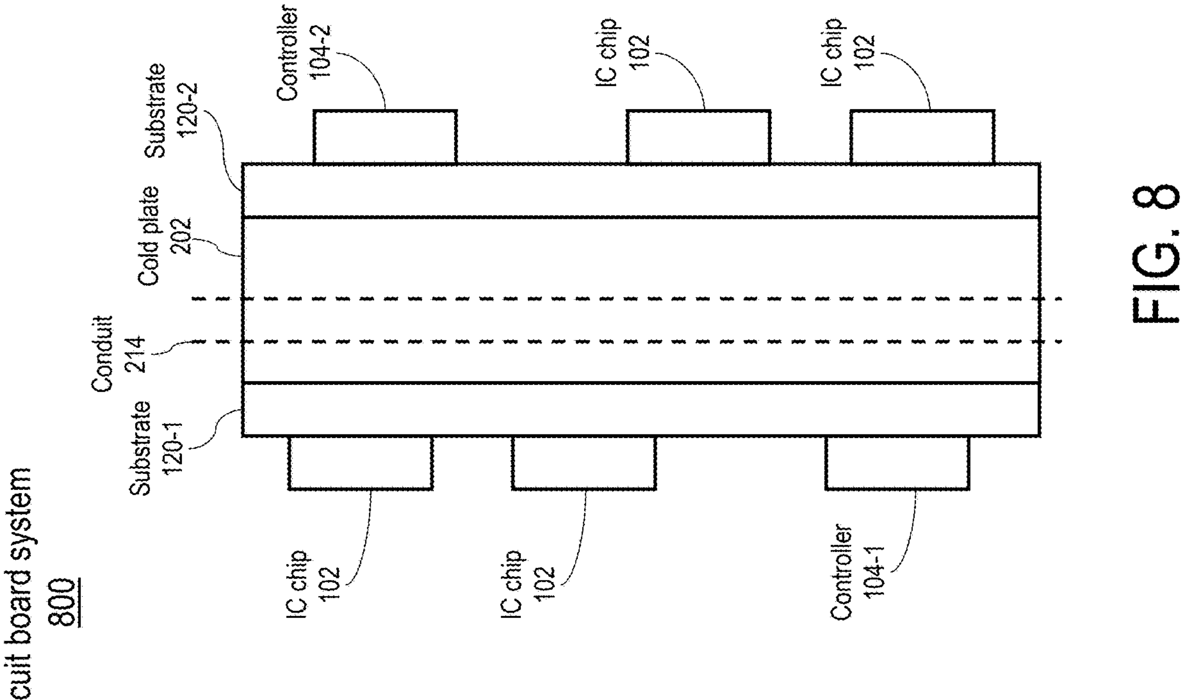
FIG. 8 is a diagram illustrating an example of a circuit board system.

In some implementations, a circuit board system includes multiple distinct substrates cooled by coolant flow through and/or on a common cold plate. For example, FIG. 8 illustrates an example of a circuit board system 800 including multiple substrates 120-1, 120-2. Each of the substrates 120-1, 120-2 (e.g., circuit boards) has multiple IC chips 102 mounted thereof, as shown in FIG. 1. In some implementations, as shown in FIG. 7, each of the substrates 120-1, 120-2 further has a controller 104-1 or 104-2 mounted thereon. In some implementations, only a single controller 104-1 or 104-2 is present or active, and the single controller controls IC chips 102 on both substrates 120-1, 120-2. In some implementations, the IC chips 102 and controllers 104-1, 104-2 are mounted on front sides of the substrates 120-1, 120-2, and back sides of the substrates 120-1, 120-2 are in contact with the cold plate 202. The cold plate 202 can therefore be sandwiched between the substrates 120-1, 120-2, and coolant flow through a conduit 214 extending in the cold plate 202 can cool IC chips 102 on both substrates 120-1, 120-2.

In some implementations, controller 104-1 is configured to control operation of IC chips 102 on substrate 120-1, and controller 104-2 is configured to control operation of IC chips 102 on substrate 120-2. In some implementations, one of the controllers 104-1, 104-2 is configured to control coolant flow through conduit 214 by adjusting one or more valves. For example, controller 104-1 can control cooling of IC chips 102 on both substrates 120-1, 120-2 by adjusting coolant flow rates through the cold plate 202, which cools both substrates 120-1, 120-2. In some implementations, a controller configured in this manner can receive temperature data from at least one IC chip on a different substrate. For example, controller 104-1 can receive temperature data from at least one IC chip 102 on substrate 120-2, and can perform coolant flow control based at least on that temperature data.

Although the foregoing description assumes coolant flow control is performed by a controller 104 on a common circuit board with the IC chips, the coolant flow control (e.g., determination of target flow states and adjustments of valves) can be performed partially or entirely by computer system(s) distinct from the controller 104. For example, in some implementations, a remote cloud computing system performs one or more processes associated with coolant flow control, e.g., receiving data characterizing IC chip operation, determining a target flow state, and/or adjusting valve(s) to effect the target flow state.

FIG. 8 illustrates the IC chips 102 facing away from the cold plate 202. However, as discussed above, in some implementations the IC chips 102 face the cold plate 202, e.g., are in contact with the cold plate 202 directly and/or through a TIM.

Figure 9:
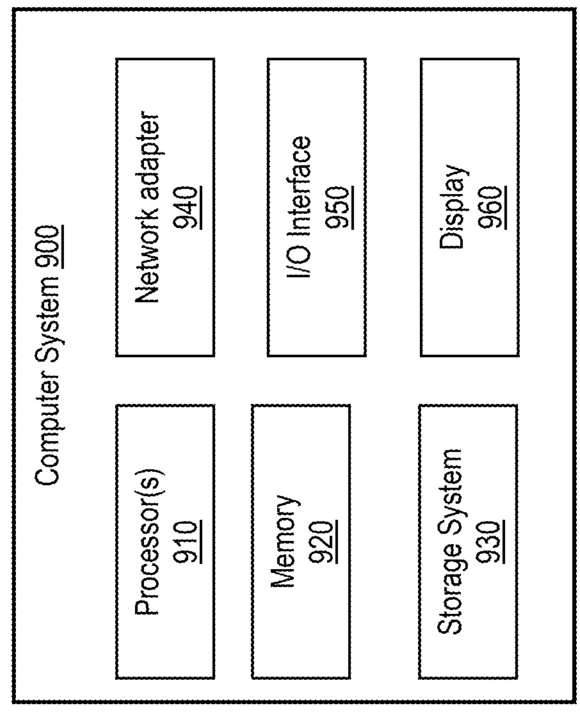
FIG. 9 is a diagram illustrating an example of a computer system.

FIG. 9 is a block diagram illustrating an example of a computer system 900. In some implementations, the controller 104 includes, is similar to, or is associated with, a computer system such as the computer system 900. The computer system 900 can be configured to perform any or all operations described herein as being performed by the controller 104.

The computer system 900 may refer to any system including a general purpose or special purpose computing system. For example, the computer system 900 may include a personal computer, a server computer, a cloud computing system, a laptop computer, a microcontroller, and/or the like. As shown in FIG. 9, the computer system 900 may include at least one processor 910, a memory 920, a storage system 930, a network adapter 940, an input/output (I/O) interface 950, and a display 960. In some implementations, the computer system 900 lacks one or more of these elements, e.g., the display 960. For example, the computer system 900 can be a board-mounted microcontroller that lacks a display.

The at least one processor 910 may execute a program module including computer system executable instructions. The program module may include routines, programs, objects, components, logic, data structures, and the like, performing a specific task or implementing a specific abstract data type. The memory 920 may include a computer system readable, non-transitory medium in the form of a volatile memory such as a random access memory (RAM). The at least one processor 910 may access the memory 920 and execute instructions loaded in the memory 920. The storage system 930 may non-volatilely store information and may include at least one program product including a program module configured to perform the operations described herein for the controller 104.

The network adapter 940 may provide a connection to a local area network (LAN), a wide area network (WAN), and/or a public network (e.g., the Internet), etc. The I/O interface 950 may provide communication channel(s) with one or more other devices, such as a peripheral device such as a keyboard, a pointing device, and/or an audio system. In some implementations, the I/O interface 950 provides communication channel(s) to circuit system components such as IC chips 102, power supply 130, sensor(s), and/or the like. For example, the I/O interface 950 can include a serial communication device (for example, an RS-232 port) for communicating with the other circuit system components. The display 960 may output various pieces of information so that a user may check the information.

In some implementations, operations described above with respect to control by the controller 104, and/or the processes of FIGS. 5A-5C, are implemented as or using a computer program product. The computer program product may include a non-transitory computer-readable medium (or storage medium) including computer-readable program instructions for causing the at least one processor 910 to perform the disclosed operations. Computer readable instructions may be, but are not limited to, assembler instructions, instruction set architecture (ISA) instructions, machine instructions, machine dependent instructions, microcode, firmware instructions, state setup data, or source code or object code written in at least one programming language.

The computer-readable medium may be any type of medium capable of non-transitorily holding and storing instructions executed by the at least one processor 910 or any instruction executable device. The computer-readable medium may be an electronic storage device, a magnetic storage device, an optical storage device, an electromagnetic storage device, a semiconductor storage device, or any combination thereof, but is not limited thereto. For example, the computer readable medium may be a portable computer diskette, a hard disk, a random access memory (RAM), a read-only memory (ROM), an electrically erasable read only memory (EEPROM), a flash memory, a static random access memory (SRAM), a compact disc (CD), a digital versatile disc (DVD), a memory stick, a floppy disk, a mechanically encoded device such as a punch card, or any combination thereof.

A number of implementations have been described. Nevertheless, it will be understood that various modifications may be made. While this disclosure contains many specific implementation details, these should not be construed as limitations on the scope of any invention or of what may be claimed, but rather as descriptions of features that may be specific to particular implementations of particular inventions. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

What is claimed is:

1. A circuit system, comprising:

a plurality of circuit board systems, wherein each circuit board system of the plurality of circuit board systems comprises:

a circuit board, a plurality of integrated circuit (IC) chips mounted on the circuit board, a cold plate thermally coupled to the circuit board, a first conduit extending through the cold plate, the first conduit configured to convey a flow of a coolant, wherein the first conduit is arranged such that the flow of the coolant through the first conduit is configured to heat and cool the circuit board, a valve configured to control a rate of the flow of the coolant through the first conduit, a controller configured to:

receive a first temperature from at least one of the plurality of IC chips, based on the first temperature, control the valve to decrease the rate of the flow of the coolant to allow the plurality of IC chips to heat to a target operating temperature range, after controlling the valve to decrease the rate of the flow of the coolant, receive a second temperature from the at least one of the plurality of IC chips, wherein the second temperature is greater than the first temperature, and based on the second temperature, control the valve to increase the rate of the flow of the coolant to cool the plurality of IC chips and maintain the plurality of IC chips at the target operating temperature range, and an enclosure housing the circuit board, the cold plate, and the controller; and a coolant source configured to supply the coolant to the plurality of circuit board systems in parallel.

2. The circuit system of claim 1, wherein the controllers of the plurality of circuit board systems are configured to control the valves of the plurality of circuit board systems independently from one another.

3. The circuit system of claim 1, comprising a heat exchanger configured to receive the coolant from each of the plurality of circuit board systems in parallel.

4. The circuit system of claim 1, wherein the coolant source comprises one or more pumps configured to push the coolant through the circuit system.

5. The circuit system of claim 1, wherein each circuit board system of the plurality of circuit board systems comprises:

a second conduit configured to convey a second flow of the coolant from a common inlet with the first conduit of the circuit board system, wherein the second flow bypasses the first conduit of the circuit board system, wherein the controller of the circuit board system is configured to control the valve to adjust the rate of the flow and a second rate of the second flow by adjusting the flow through the first conduit and the second flow through the second conduit.

6. The circuit system of claim 5, wherein, for each circuit board system of the plurality of circuit board systems, the valve is positioned in the second conduit.

7. The circuit system of claim 5, wherein, for each circuit board system of the plurality of circuit board systems, the valve is positioned in the first conduit.

8. The circuit system of claim 5, wherein, for each circuit board system of the plurality of circuit board systems, the second conduit bypasses the cold plate.

9. The circuit system of claim 5, wherein each circuit board system of the plurality of circuit board systems comprises a flow restrictor configured to restrict the second flow of the coolant through the second conduit.

10. The circuit system of claim 9, wherein, for each circuit board system of the plurality of circuit board systems, the flow restrictor is positioned in the second conduit.

11. The circuit system of claim 10, wherein, for each circuit board system of the plurality of circuit board systems, the flow restrictor comprises a member that fills a cross-section of the second conduit and comprises one or more holes having a smaller total cross-sectional area than a cross-sectional area of the second conduit.

12. The circuit system of claim 1, wherein, for each circuit board system of the plurality of circuit board systems, the valve comprises a binary valve.

13. The circuit system of claim 1, wherein each circuit board system of the plurality of circuit board systems comprises:

a power supply unit configured to provide power to the plurality of IC chips; and a third conduit configured to convey a third flow of the coolant to cool the power supply unit, wherein the flow of the coolant through the first conduit is from the third conduit.

14. The circuit system of claim 13, wherein, for each circuit board system of the plurality of circuit board systems, a second flow rate of the coolant through the third conduit is substantially insensitive to adjustment by the valve.

15. The circuit system of claim 13, wherein each circuit board system of the plurality of circuit board systems comprises:

a second cold plate that is thermally coupled to the power supply unit, wherein the third conduit extends through the second cold plate.

16. The circuit system of claim 1, wherein, for each circuit board system of the plurality of circuit board systems, the controller is configured to:

determine a future computation frequency or future power supply voltage of at least one of the plurality of IC chips;

predict at least one temperature of the plurality of IC chips based on the predicted future computation frequency or future power supply voltage; and control the valve based at least on the predicted at least one temperature.

17. The circuit system of claim 1, wherein each circuit board system of the plurality of circuit board systems is configured such that a total flow rate of the coolant through the circuit board system varies by 20% or less over a full range of settings of the valve.

18. The circuit system of claim 1, wherein, for each circuit board system of the plurality of circuit board systems, the plurality of IC chips are configured to perform a common type of computation in parallel with one another, wherein the common type of computation comprises a hash computation or a machine learning computation.

* * * * *